United States Patent [19]

Murayama et al.

[11] 4,423,520

[45] Dec. 27, 1983

[54] QUANTIZATION CIRCUIT FOR IMAGE DATA TRANSMISSION SYSTEM

[75] Inventors: Tomio Murayama; Kenji Koguchi, both of Kanagawa; Shigehumi Takeuchi; Kazumi Tsukioka, both of Nagano, all of Japan

[73] Assignee: Fuji Xerox Co., Ltd., Tokyo, Japan

[21] Appl. No.: 217,303

[22] Filed: Dec. 17, 1980

[30] Foreign Application Priority Data

Dec. 18, 1979 [JP] Japan ................ 54-163596

[51] Int. Cl.$^3$ ............................................ H03L 7/06
[52] U.S. Cl. ..................................... 375/95; 328/155; 375/120
[58] Field of Search ............ 364/178, 179; 328/155, 328/179; 329/124; 358/280, 281, 284; 340/347 SH; 375/110, 120, 4, 95

[56] References Cited

U.S. PATENT DOCUMENTS

| | | | |
|---|---|---|---|
| 3,462,551 | 8/1969 | Fong | 375/120 |
| 3,805,180 | 4/1974 | Widmer | 375/120 |
| 3,949,199 | 4/1976 | Odom | 235/92 SH |
| 3,992,581 | 11/1976 | Davis | 375/120 |
| 4,117,409 | 9/1978 | O'Brien | 340/347 SH |
| 4,300,164 | 11/1981 | Sacks | 358/284 |
| 4,302,845 | 11/1981 | McClaughry et al. | 375/95 |

*Primary Examiner*—Benedict V. Safourek
*Attorney, Agent, or Firm*—Sughrue, Mion, Zinn, Macpeak, and Seas

[57] ABSTRACT

A signal receiver quantization circuit for an image data transmission device in which received signals are quantized correctly even if they are subjected to distortion in their time positions so that degradation of the received images is prevented. In accordance with the invention, a signal receiver includes a digital PLL circuit, a PLL control circuit for detecting the transition times of an input received signal with the digital PLL circuit being controlled in accordance with an output of the PLL control circuit, and a circuit for sampling the input signal in response to an output signal of the digital PLL circuit. In a preferred embodiment, the PLL control circuit detects the transition times of the input signal only during predetermined time slots determined in accordance with the relative phase between the input received signal and a sampling clock.

6 Claims, 11 Drawing Figures

QUANTIZATION CIRCUIT FOR IMAGE DATA TRANSMISSION SYSTEM

BACKGROUND OF THE INVENTION

The present invention relates to a circuit for quantizing a received signal in time at the signal receiving side of an image transmission system such as a facsimile system. More particularly, the invention relates to a quantization circuit in which the received signal can be correctly quantized even if it has been subjected to distortion such as by fluctuations in time caused, for instance, by transmission circuit difficulties.

Heretofore, in a facsimile system or the like, received signals demodulated by the demodulator were processed in a digital mode with the received signals, which are inputted continuously, being quantized by sampling at equal intervals during every scanning line. In these systems, the sampling interval t is:

$$t = (T - T'/n)$$

where n is the number of bits provided per scanning line, T is the scanning line transmission period, and T' is the period during which other than image data is received such as is used for synchronization.

If a signal quantized with a period t as shown in FIG. 1A is transmitted by the signal transmission side and the signal thus quantized is transmitted under the condition that no distortion is caused by the transmission system which includes the transmission lines and MODEMs (modulator and demodulator), then the signal can always be received correctly when sampling is carried out at the signal receiving side with the sampling timing shifted from the transition times of the signal at the signal transmission side by t/2 as shown in FIG. 1B.

However, if the received signal has been subjected to distortion such as by fluctuating in the time position of the signal caused by transmission circuit problems as illustrated in FIG. 1C, then in the conventional system with the fixed sampling interval t, the distortion affects the sampling result at the signal receiving side. That is, jittering is caused in the recorded image. Thus, the conventional system suffers from a drawback that the recovered image can be considerably low in quality.

Accordingly, an object of the invention is to provide a system for quantizing received signals in which all of the above-described difficulties accompanying a conventional system have been eliminated and received signals can be quantized correctly even if they have undergone distortion such as by fluctuations in their time position so that degradation of the received images is prevented.

SUMMARY OF THE INVENTION

In accordance with this and other objects of the invention, there is provided a signal receiver quantization circuit for an image data transmission device in which an input signal quantized and transmitted by a signal transmission side is quantized in a signal receiver. The signal receiver includes a digital PLL circuit, a PLL control circuit for detecting transition times of an input signal received signal with the digital PLL circuit being controlled in accordance with an output signal of the PLL control circuit, and means for sampling the input signal in response to an output signal of the digital PLL circuit. The digital PLL circuit preferably includes a phase comparison circuit for comparing the phase of the output signal of the PLL control circuit with that of a sampling clock which is used to sample the input signal, a frequency division ratio setting circuit for setting a frequency division ratio for a reference clock according to an output of the phase comparison circuit, and a frequency divider for frequency dividing the reference clock in response to the frequency division ratio setting circuit to thereby output the sampling clock.

Further, the PLL control circuit preferably includes means for forming the logic product of the output of a detection circuit composed of two D flip-flop circuits to detect the transition times of the input signal and an estimated transition signal which is detected in accordance with the sampling clock. Thereby, the PLL control circuit outputs the estimated transition time signal only in the vicinity of an estimated transition time.

DESCRIPTION OF THE PREFERRED EMBODIMENTS

A preferred embodiment of the invention will be described with reference to FIGS. 1C–1F and FIG. 2.

Figure 1A:
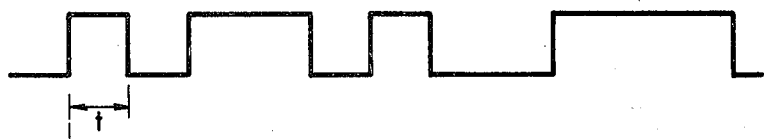
FIG. 1 is a timing chart for a description of a first preferred embodiment of the invention.
Figure 1B:
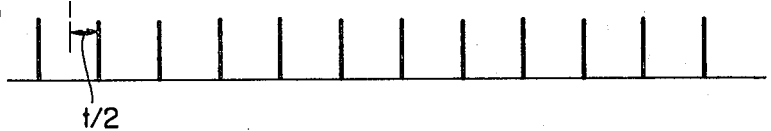
Figure 1C:
Figure 1D:
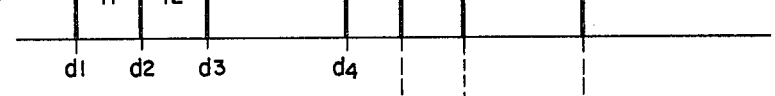
Figure 1E:
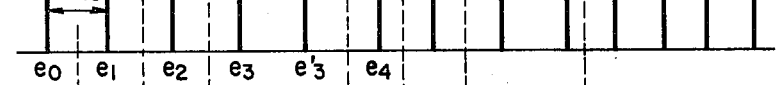
Figure 1E:
Figure 1F:
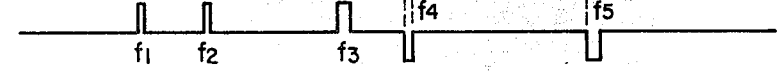

In the system according to the invention, when distortion such as a fluctuation in the time position of a received signal is present as shown in FIG. 1C, the transition times at which the level of the received signal changes from "0" to "1" or from "1" to "0" are detected as shown in FIG. 1D. Let us consider the case where the sampling timing is corrected so that the time lag between a pulse $d_2$ and a sampling time $e_2$ approaches $t_1/2$, the time lag between a pulse $d_3$ and a sampling time $e_3$ approaches $t_2/2$ and so forth (where, in FIG. 1D, $t_1$ is the interval between pulses $d_1$ and $d_2$, $t_2$ is the interval between pulses $d_2$ and $d_3$, and so forth) so that the sampling timing is as indicated in FIG. 1E to thereby perform distortionfree quantization.

Figure 2:
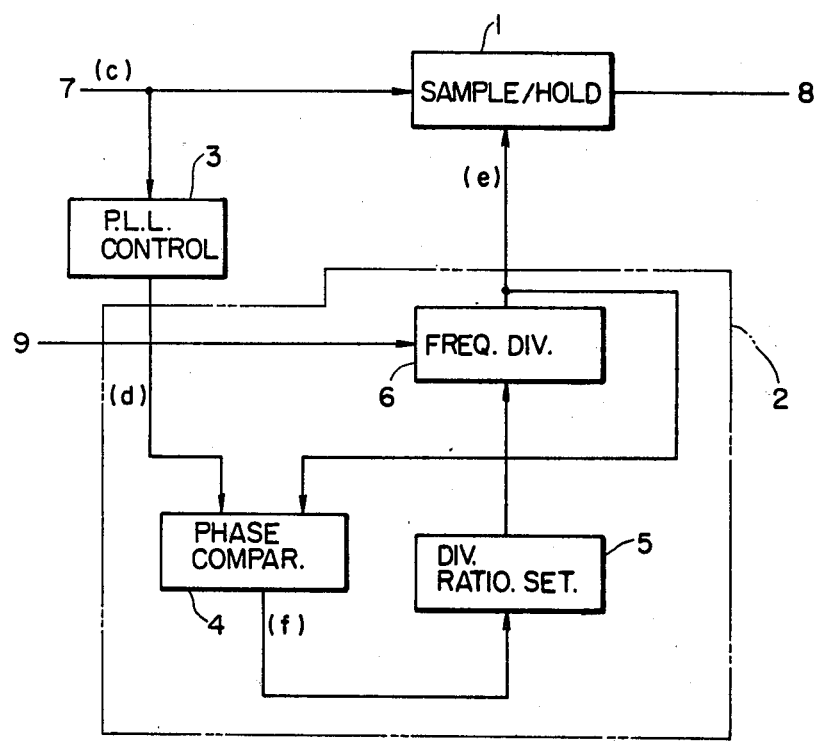
FIG. 2 is a block diagram showing a preferred embodiment of the invention.

In the block diagram of FIG. 2, in a digital PLL (phase-locked loop) 2, a reference clock 9 is frequency-divided by a frequency divider 6 in a frequency division ratio which is set by a frequency division ratio setting circuit 5. The frequency divider 6 outputs a sampling clock (e). The initial setting operation is carried out so that the set value N of the frequency division ratio setting circuit 5 is $N \simeq t_0 \cdot f_0$ where N is the frequency division ratio set by the frequency division ratio setting circuit 5, $t_0$ is the sampling clock pulse interval on the signal transmission side, and $f_0$ is the reference clock frequency.

It is assumed that an input signal 7 as indicated in FIG. 1C is applied to the circuit in FIG. 2. In this case, a PLL control circuit 3 detects the transition times from "0" to "1" and from "1" to "0" in the input signal 7 and in response thereto provides a pulse train as shown in FIG. 1D. Here, it is assumed that the pulse train is composed of the pulses $d_1$, $d_2$, $d_3$, ... and the sampling clock pulse having the pulse interval $t_0$ is the pulse $e_1$ in FIG. 1E. With this assumption, the phases of the pulses $e_1$ and $d_1$ are compared by a phase comparator 4 in response to the output of which the set value of the frequency division ratio setting circuit 5 is corrected so that the pulse difference, expressed in time, between the next pulse $d_2$ and the pulse $e_2$ approaches $t_1/2$. According to the set value thus corrected, the frequency divider 6 frequency-divides the reference clock 9 to output the next sampling clock $e_2$. Similarly, the phase of the pulse $e_2$ is compared with that of the pulse $d_2$ by the phase comparator 4 and the set value of the frequency division ratio setting circuit 5 is corrected so that the phase difference between the pulses $d_3$ and $e_3$ approaches $t_2/2$. Thus, the frequency division ratio set by the frequency division ratio setting circuit 5 is adjusted (increased or decreased) so that the phase difference between the pulses of the pulse trains (d) and (e) approach $t_i/2$ (where i=1, 2, ...). That is, if the phase of the sampling clock (e) leads that of the output signal of the PLL control circuit 3 by more than $t_i/2$, the phase comparator 4 outputs signals such as those indicated by $f_1$, $f_2$ and $f_3$ in FIG. 1F to increase the frequency division ratio, while if the phase of the sampling clock e legs that the output signal of the PLL control circuit 3 by less than $t_i/2$, the phase comparator 4 outputs signals such as those indicated by $f_4$ and $f_5$ in FIG. 1F to decrease the frequency division ratio. The frequency division ratio is varied only when the PLL control circuit 3 detects a transition time occurrence. That is, the frequency division ratio is maintained unchanged when the PLL control circuit 3 detects no transition time. The pulses shown in FIG. 1E' are obtained by shifting the phases of the pulses shown in FIG. 1E by $t_i/2$.

Another embodiment of the invention will be described with reference to FIGS. 3 and 4.

In the first embodiment described above, erroneous operations would possibly be carried out if sharp pulses are present in the waveform shown in FIG. 1C due to the occurrence of noise signals or momentary circuit interruptions. In order to prevent such erroneous operations, in the second embodiment, the PLL control circuit 3 in FIG. 2 is allowed to detect the transition times only in the vicinity of the waveform regions where the occurrence of a transition time is expected, that is, where the phase lags that of the sampling clock 10 by $t_i/2$. FIG. 3 is a detailed diagram showing a modification of the PLL control circuit 3 of FIG. 2 in which the possibility of the abovedescribed erroneous operations has been eliminated.

Figure 3:
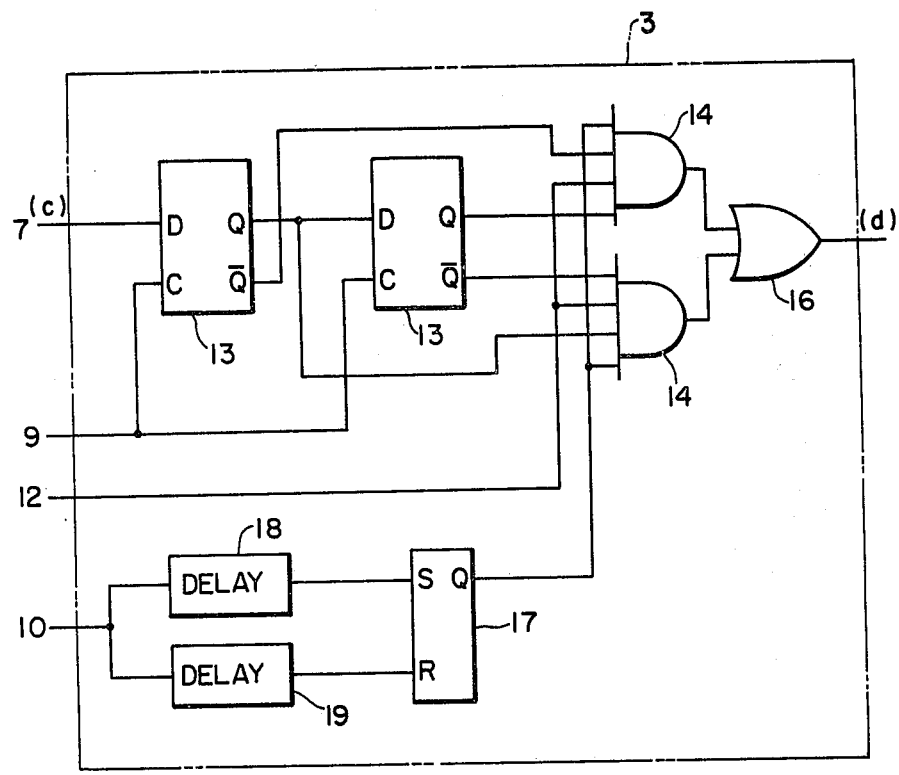
FIG. 3 is a block diagram showing a PLL control circuit in detail.
Figure 4A:
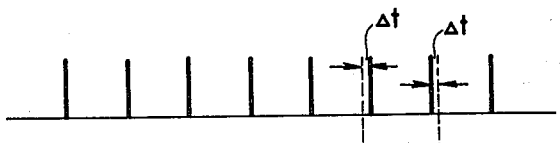
FIGS. 4A and 4B together define a timing chart for a description of the operation of the PLL control circuit of FIG. 3.

In FIG. 3, reference numeral 7 designates an input signal, 9 a reference clock signal, 10 a sampling clock, and 12 an enabling signal. The enabling signal is set to "0" when the transmission side is not delivering a signal which, as shown in FIG. 1A, the pulse durations are integer multiple of time t. Further in FIG. 3, reference numerals 18 and 19 designate delay circuits.

Figure 4B:

It is assumed that, when the sampling clock 10 is inputted to the delay circuits 18 and 19, the delay circuit 18 delays the sampling clock 10 by $t_i/2 - \Delta t$ while the sampling clock 10 is delayed by the delay circuit 19 by $t_i/2 + \Delta t$. Thus, the output of an RS flip-flop circuit 17 as shown in FIG. 4B is raised to "1" only in the vicinity of a time which is shifted by $t_i/2$ from the sampling clock 10 shown in FIG. 1A. In other words, the output of the RS flip-flop circuit 17 is raised to "1" in the range $+\Delta t$ of a time which is shifted by $t_i/2$ from the sampling clock 10.

The outputs of two D flip-flop circuits connected as shown in FIG. 3, the enabling signal and the output of the RS flip-flop circuit 17 are applied to two 4-input AND circuits. When both the enabling signal and the output of the RS flip-flop circuit 17 are at "1", a signal having a pulse width $1/f_0$ is outputted as a comparison signal (d) for every transition time. When one or both of the enabling signal and the output of the RS flip-flop circuit 17 are at "0", no comparison signal (d) is outputted. Thus, the comparison signal (d) is provided only in the vicinity of time which are shifted in phase from the sampling clock (e) by $t_i/2$. Accordingly, erroneous operations due to the occurrence of noise signals or momentary circuit interruptions are substantially prevented.

In practice, there is no problem even if the delay times of the delay circuits 18 and 19 are set to $t_0/2 - \Delta t$ and $t_0/2 + \Delta t$, respectively, because $t_0 \simeq t_i$.

As is apparent from the above description, according to the invention, a digital circuit and the control circuit for controlling the frequency division ratio setting timing in the digital circuit are provided for a signal receiving side sampling circuit which prevents image quality degradation due to fluctuations in the time position of received signals which may be caused by transmission circuit distortion or the like.

What is claimed is:

1. A signal receiver quantization circuit for an image data transmission device in which an input signal which is quantized and transmitted by a signal transmissions side is quantized in a signal receiver comprising: a digital PLL circuit; a sampling clock producing an output signal; a PLL control circuit for detecting transition times of an input received signal; said digital PLL circuit being controlled in accordance with an output signal of said PLL control circuit; and means for sampling said input signal in response to said sampling clock output signal of said digital PLL circuit, said sampling clock output signal is produced as a direct function of the previous transition pulse period such that $$e_n - d_n = t_{\frac{n-1}{2}},$$

where $e_n$ is said sample pulse, $d_n$ is said transition pulse and $t_{n-1}$ is the previous transition pulse period.

2. The circuit as claimed in claim 1 wherein said digital PLL circuit comprises a phase comparison circuit for comparing the phase of said output signal of said PLL control circuit with that of said sampling clock adapted to sample said input signal; a frequency division ratio setting circuit for setting a frequency division ratio for a reference clock according to the output of said phase comparison circuit; and a frequency divider for frequency-dividing said reference clock in response to the output of said frequency division ratio setting circuit to output said sampling clock output signal adopted to sample said input signal.

3. The system as defined in claim 1 wherein said PLL control circuit comprises means for forming the logic produce of (a) an output of a detection circuit, comprising two D flip-flop circuits to detect the transition times of said input signal, and (b) an output of an estimation circuit, comprising delay means receiving said sampling clock signal and an S flip-flop circuit, for detecting an estimated transition time signal, whereby said means for forming said logic product outputs said estimated transition time signal only in the vicinity of an estimated transition time.

4. The system as claimed in claim 2 wherein said frequency division ratio setting circuit sets an initial frequency division ratio of said frequency divider of N where N is approximately $t_0f_0$ where $t_0$ is the sampling clock pulse interval on said signal transmission side and $f_0$ is the frequency of said reference clock.

5. The system as claimed in claim 1 wherein said PLL control circuit comprises means for detecting said transition times only in vicinities of times where the phase lags the sampling clock output signal by $t_i/2$ where, $t_i$ is the pulse period.

6. The system as claimed in claim 5 wherein said transition times detecting means comprises means for comparing the phase of said input signal with the phase of said sampling clock adapted to sample said input signal.

* * * * *